United States Patent [19]
Brownell et al.

[11] Patent Number: 5,956,229
[45] Date of Patent: Sep. 21, 1999

[54] INJECTION MOLDED THERMAL INTERFACE SYSTEM

[75] Inventors: Michael Brownell, Los Gatos; Dan McCutchan, Redwood City, both of Calif.; Hong Xie, Chandler, Ariz.; Kevin Haley, San Jose, Calif.

[73] Assignee: Intel Corporation, Santa Clara, Calif.

[21] Appl. No.: 09/053,238

[22] Filed: Apr. 1, 1998

[51] Int. Cl.⁶ ........................................... H05K 7/20
[52] U.S. Cl. ................... 361/699; 361/700; 361/704; 361/719; 257/714; 257/715; 174/15.2; 165/80.4; 29/890.032
[58] Field of Search ................... 361/687, 699, 361/700, 702, 717–719, 722; 257/712–714, 706, 707; 165/80.3, 80.4, 104.33, 185; 174/15.1, 15.2

[56] References Cited

U.S. PATENT DOCUMENTS

| | | | |
|---|---|---|---|
| 4,204,246 | 5/1980 | Arii et al. | 361/699 |
| 4,612,978 | 9/1986 | Cutchaw | 361/700 |
| 5,095,404 | 3/1992 | Chao | 361/700 |
| 5,331,510 | 7/1994 | Ouchi et al. | 361/702 |
| 5,353,192 | 10/1994 | Nordin | 361/700 |
| 5,355,942 | 10/1994 | Conte | 165/104.33 |
| 5,409,055 | 4/1995 | Tanaka et al. | 361/700 |
| 5,412,535 | 5/1995 | Chao et al. | 361/700 |
| 5,697,428 | 12/1997 | Akachi | 361/700 |
| 5,699,227 | 12/1997 | Kolman et al. | 361/700 |

*Primary Examiner*—Leo P. Picard
*Assistant Examiner*—Boris L. Chervinsky
*Attorney, Agent, or Firm*—Blakely, Sokoloff, Taylor & Zafman

[57] ABSTRACT

A printed circuit board assembly that has a heatpipe. The assembly includes an integrated circuit package that is mounted to a printed circuit board. The heatpipe is attached to a plastic mold that is mounted to the printed circuit board. When assembled to the circuit board, the heatpipe is thermally coupled to the integrated circuit package. The plastic mold is lightweight and relatively inexpensive to produce. The mold also provides enough structural rigidity to prevent warping of the heatpipe.

11 Claims, 2 Drawing Sheets

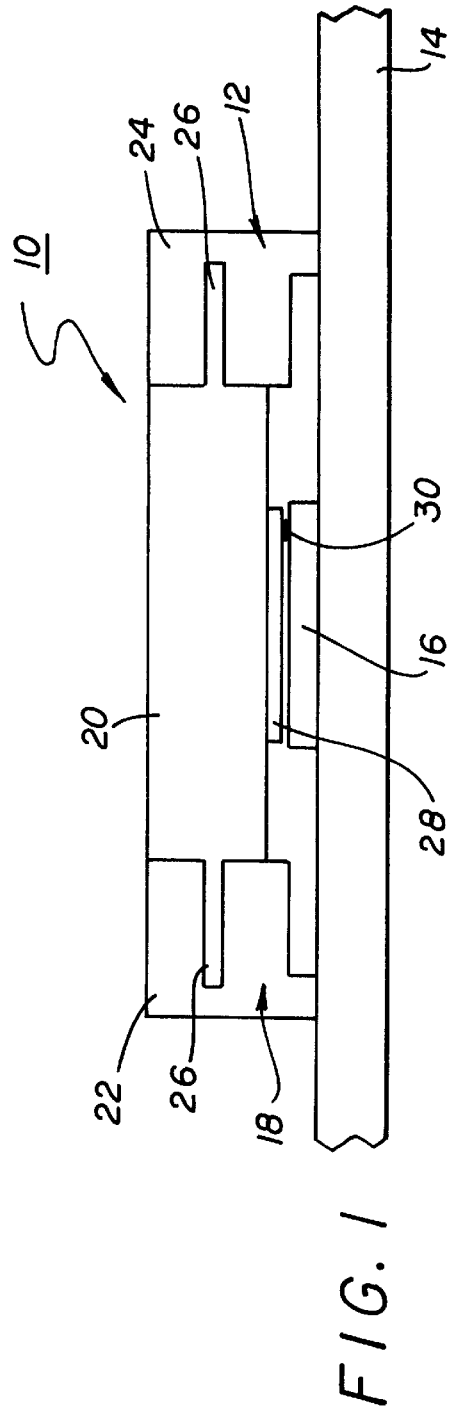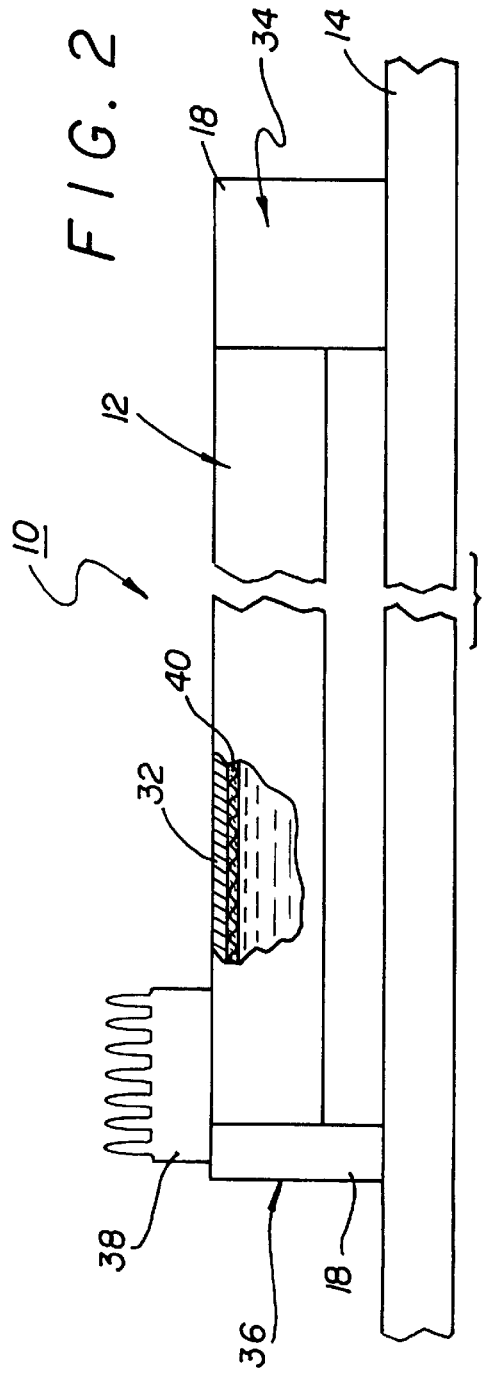

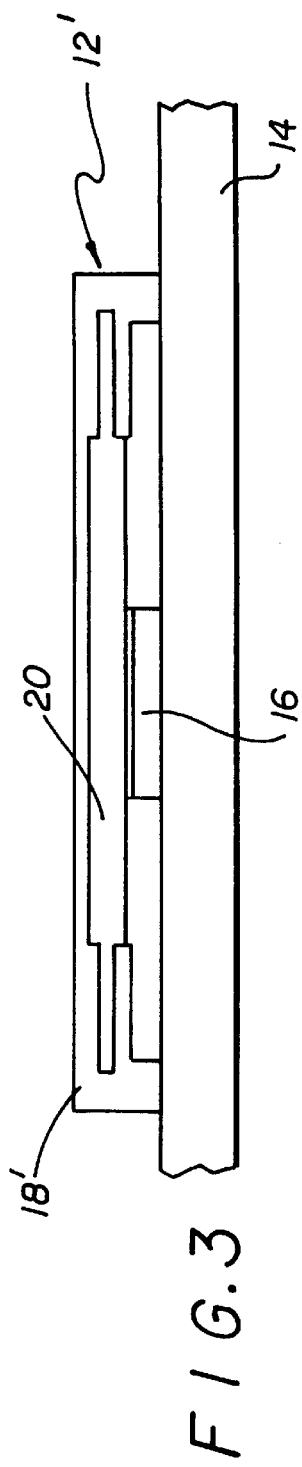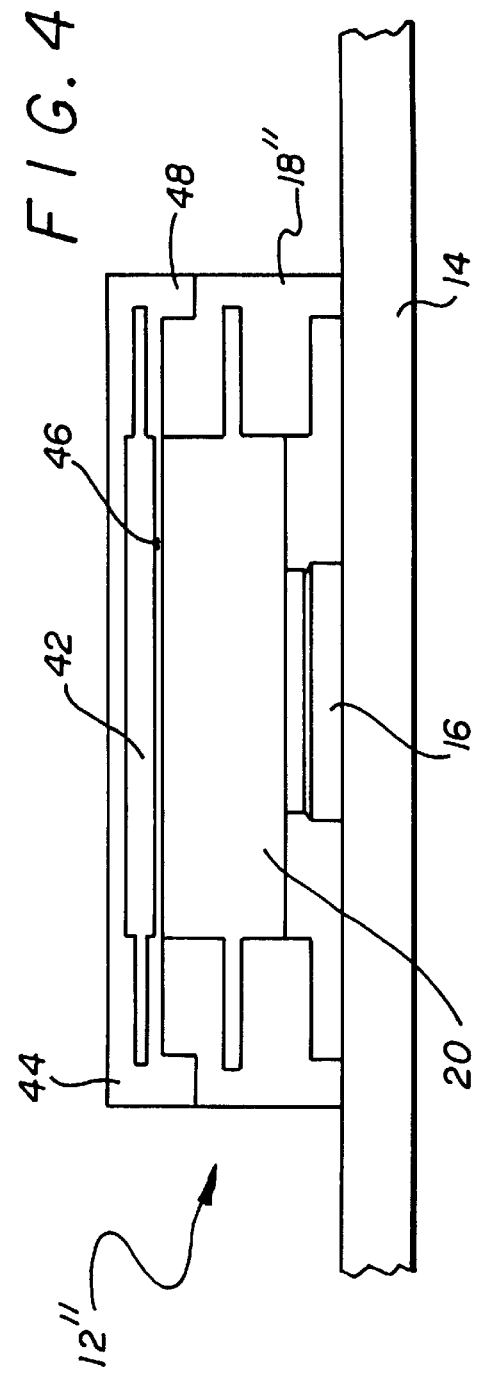

INJECTION MOLDED THERMAL INTERFACE SYSTEM

BACKGROUND OF THE INVENTION

1. Field of the Invention

The present invention relates to a printed circuit board assembly that contains a heatpipe.

2. Description of Related Art

Integrated circuits are typically assembled into packages that are mounted to a printed circuit board(s). The integrated circuits generate heat which must be removed from the package. Some packages incorporate heat slugs and/or heat sinks to increase the heat transfer rate between the integrated circuit and the surrounding ambient air.

There have been developed integrated circuit packages which generate a relatively large amount of heat. For example, there have been developed multi-chip modules (MCM) which contain a number of individual integrated circuits. The heat generated by some MCMs require a cooling system that is more efficient than conventional heat sinks and heat slugs.

There have been developed computer products which utilize heat pipes to remove heat generated by integrated circuits. Heatpipes contain an internal fluid that transfers and removes the heat from the integrated circuit packages. The fluid is evaporated at one end of the heatpipe and then condensed at an opposite end of the pipe. The evaporation process pumps the fluid to the condensor portion of the heatpipe. The heatpipe also contains an internal wick that allows the condensed fluid to be drawn back to the evaporation portion of the pipe to complete the cycle.

The heatpipes are typically mounted to the printed circuit board assembly with a contact plate. The contact plate is machined from a metal material. Machining metal is a relatively expensive manufacturing process. Additionally, the metal material increases the weight of the system. It would therefore be desirable to provide a means for coupling a heatpipe to a computer assembly that is inexpensive and lightweight.

The tubular wall of a heatpipe is relatively thin to minimize the thermal impedance of the pipe. Unfortunately, the thin wall does not provide a large amount of stiffness. It has been found that heatpipes may bend and warp when subjected to the thermal cycling of a computer. The warping may create voids and spaces between the heatpipe and the integrated circuit package. The spaces increase the thermal resistance of the assembly and the junction temperature of the integrated circuits. It would therefore be desirable to provide a heatpipe assembly that is lightweight, inexpensive and structurally rigged enough to prevent warping of the pipe.

SUMMARY OF THE INVENTION

The present invention is a printed circuit board assembly that has a heatpipe. The assembly includes an integrated circuit package that is mounted to a printed circuit board. The heatpipe is attached to a plastic mold that is mounted to the printed circuit board. When assembled to the circuit board, the heatpipe is thermally coupled to the integrated circuit package. The plastic mold is lightweight and relatively inexpensive to produce. The mold also provides enough structural rigidity to prevent warping of the heatpipe.

BRIEF DESCRIPTION OF THE DRAWINGS

FIG. 1 is a front view of a printed circuit board assembly of the present invention;

FIG. 2 is a side view of the printed circuit board assembly;

FIG. 3 is a front view of an alternate embodiment of a heatpipe subassembly;

FIG. 4 is a front view of an alternate embodiment of a heatpipe subassembly.

DETAILED DESCRIPTION OF THE INVENTION

Referring to the drawings more particularly by reference numbers, FIGS. 1 and 2 show a printed circuit board assembly 10 of the present invention. The printed circuit board assembly 10 includes a heatpipe subassembly 12 that is attached to a printed circuit board 14. The assembly 10 also includes an integrated circuit package 16 that is mounted to the printed circuit board 14. The integrated circuit package 16 contains an integrated circuit (not shown) that is coupled to the circuit board 14 through internal routing and external contacts of the package 16 as is known in the art. The integrated circuit package 16 may be a multi-chip module (MCM) that contains a microprocessor and a number of cache memory circuits. Although it is to be understood that the package 16 may contain any electrical device.

The heatpipe subassembly 12 includes a plastic mold 18 that is attached to a heatpipe 20. The mold 18 may include a first piece 22 that is attached to a first side of the pipe 20 and a second piece 24 that is attached to a second side of the pipe 20. The heatpipe 20 may have a pair of flanges 26 that are embedded into the first 22 and second 24 pieces to secure the pipe 20 to the plastic mold 18. The plastic mold 18 may be constructed by directly molding plastic material onto the heatpipe 20. Alternatively, the subassembly 12 may be constructed by initially molding the first 22 and second 24 pieces, and then attaching the parts to the pipe 20 by inserting the flanges 26 into corresponding grooves formed in the pieces 22 and 24. The plastic mold 18 is lightweight, inexpensive and provides structural rigidity to the heatpipe 20 to prevent warping and bending of the pipe 20.

The mold 18 can be attached to the printed circuit board 14 by an adhesive, fasteners or any other means for connecting the two devices. The heat pipe 20 is thermally coupled to the integrated circuit package 16 to remove heat generated by the integrated circuit. Although the plastic mold 18 is shown mounted to the printed circuit board, it is to be understood that the mold 18 can be attached to another member, such as the base plate of a computer chassis.

A platen 28 may be attached to the heatpipe 20 and pressed into contact with the integrated circuit package 16. The platen 28 is relatively flat to minimize the voids and spaces between the heatpipe 20 and the package 16. A thermal grease or epoxy 30 may be applied between the package 16 and the platen 28 to reduce the thermal impedance of the assembly 10. The platen 28 may be a metal plate that is bonded or otherwise attached to the heatpipe 20.

The heatpipe 20 includes an outer tubular member 32 that contains an internal fluid. The fluid transfers heat from an evaporator portion 34 of the pipe 20 to a condenser portion 36 of the pipe 20. The evaporation of the fluid in the evaporator portion 34 increases the fluid pressure within the pipe. The increased pressure drives the evaporated fluid to the condenser portion 36. The condenser portion 36 may be attached to a heat sink 38 that removes the heat from the heatpipe 20 and condenses the fluid. Although a heat sink 38 is shown and described, it is to be understood that the heatpipe 20 can operate without a sink 38. The condensed fluid is drawn back to the evaporator portion 34 through an internal wick 40, wherein the process is repeated. Heatpipes 20 provide a highly efficient means for removing a large amount of heat from the integrated circuit package 16.

The printed circuit board assembly 10 can be assembled by initially mounting the package 16 to the circuit board 14. The mold 18 is then mounted to the circuit board 14 to thermally couple the heatpipe 20 to the package 16. A thermal grease or epoxy 30 may be applied to the bottom of the platen 28 or the top of the package 16 before the mold 18 is attached to the circuit board 14.

FIG. 3 shows an alternate embodiment of a heatpipe subassembly 12' which has one plastic mold 18' that extends across the top surface of the a relatively thin heatpipe 20. The heatpipe 20 may, or may not, have a platen (not shown). The single molded piece 18 may provide additional structural rigidity to maintain the flatness of the heatpipe during storage and handling.

FIG. 4 shows another alternate embodiment of a heatpipe subassembly 12" which has a second heatpipe 42 attached to a first heatpipe 20 by a second molded member 44. A thermal grease or epoxy 46 may be applied to the heatpipe/heat sink interface to reduce the thermal impedance of the assembly 12". The second molded member 44 may have feet 48 that are inserted into corresponding grooves of the plastic mold 18".

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A heatpipe assembly for an integrated circuit package, comprising:

a heatpipe that has an evaporation portion and a condenser portion, said heatpipe having a flange that extends from a side of said evaporator portion; and, a plastic mold that is attached to said heatpipe in a manner that exposes said evaporator portion between a pair of feet within said plastic mold and so said flange is embedded within said plastic mold.

2. The assembly as recited in claim 1, wherein said plastic mold includes a first piece that is attached to a first side of said heatpipe and a second piece that is attached to an opposite second side of said heatpipe.

3. The assembly as recited in claim 1, further comprising a platen that is attached to said heatpipe.

4. The assembly as recited in claim 1, further comprising a heat sink that is attached to said heat pipe.

5. A printed circuit board assembly, comprising:

a printed circuit board;

a plastic mold that is attached to said printed circuit, said plastic mold having a pair of feet that are mounted to said printed circuit board;

a heatpipe that is attached to said plastic mold in a manner that exposes an evaporator portion of said heatpipe between said feet of said plastic mold, said heatpipe having a flange that extends from a side of said evaporator portion and is embedded into said plastic mold; and, an integrated circuit package that is mounted to said printed circuit board and thermally coupled to said heatpipe.

6. The assembly as recited in claim 5, wherein said plastic mold includes a first piece that is attached to a first side of said heatpipe and a second piece that is attached to an opposite second side of said heatpipe.

7. The assembly as recited in claim 5, further comprising a platen that is attached to said heatpipe and thermally coupled to said integrated circuit package.

8. The assembly as recited in claim 5, further comprising a heat sink that is attached to said heat pipe.

9. A method for assembling a printed circuit board assembly, comprising the steps of:

a) providing a heatpipe that is attached to a plastic mold in a manner that exposes an evaporator portion of said heatpipe between a pair of feet of said plastic mold, said heatpipe having a flange that extends from a side of said evaporator portion and is embedded into said plastic mold;

b) mounting an integrated circuit package to a printed circuit board; and c) attaching feet of said plastic mold to said printed circuit board to thermally couple said evaporator portion of said heatpipe to said integrated circuit package.

10. The method as recited in claim 9, further comprising the step of attaching a heat sink to said heatpipe.

11. The method as recited in claim 9, further comprising the step of applying a thermally conductive material onto said integrated circuit package or said heatpipe before step (c).

* * * * *